United States Patent
Lee et al.

(10) Patent No.: US 9,576,617 B1
(45) Date of Patent: *Feb. 21, 2017

(54) MULTIPORT MEMORY ELEMENT CIRCUITRY

(71) Applicant: Altera Corporation, San Jose, CA (US)

(72) Inventors: Shih-Lin S. Lee, San Jose, CA (US); Peter J. McElheny, Morgan Hill, CA (US); Preminder Singh, Fremont, CA (US); Shankar Sinha, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 14/297,063

(22) Filed: Jun. 5, 2014

Related U.S. Application Data (63) Continuation of application No. 13/149,249, filed on May 31, 2011, now Pat. No. 8,755,218.

(51) Int. Cl.
| | |
|---|---|
| *G11C 8/16* | (2006.01) |
| *G11C 7/00* | (2006.01) |
| *G06F 12/14* | (2006.01) |

(52) U.S. Cl.
CPC ............ *G11C 7/00* (2013.01); *G06F 12/1425* (2013.01); *G11C 8/16* (2013.01)

(58) Field of Classification Search
CPC ..... G11C 2029/0411; G11C 8/16; G11C 7/00; G11C 11/412; G11C 7/1075; G06F 12/1425
See application file for complete search history.

(56) References Cited

U.S. PATENT DOCUMENTS

| | | |
|---|---|---|
| 5,502,683 A | 3/1996 | Marchioro |
| 6,061,267 A | 5/2000 | Houston |
| 6,091,627 A | 7/2000 | Luo et al. |
| 6,711,086 B2* | 3/2004 | Terada ............... G11C 8/16 |
| | | 365/189.04 |

(Continued)

FOREIGN PATENT DOCUMENTS

| | | |
|---|---|---|
| CN | 1679113 | 10/2005 |
| CN | 101501860 | 8/2009 |

(Continued)

OTHER PUBLICATIONS

Liu et al. U.S. Appl. No. 12/629,831, filed Dec. 2, 2009.

*Primary Examiner* — Khamdan Alrobaie
(74) *Attorney, Agent, or Firm* — Treyz Law Group; Vineet Dixit; Jason Tsai (57) ABSTRACT

Integrated circuits with multiport memory elements may be provided. A multiport memory element may include a latching circuit, a first set of address transistors, and a second set of address transistors. The latching circuit may include cross-coupled inverters, each of which includes a pull-up transistor and a pull-down transistor. The first set of address transistors may couple the latching circuit to a write port, whereas the second set of address transistors may couple the latching circuit to a read port. The pull-down transistors and the second set of address transistors may have body bias terminals that are controlled by a control signal. During data loading operations, the control signal may be temporarily elevated to weaken the pull-down transistors and the second set of address transistors to improve the write margin of the multiport memory element.

17 Claims, 6 Drawing Sheets

(56) References Cited

U.S. PATENT DOCUMENTS

| | | | |
|---|---|---|---|
| 6,909,135 B2 * | 6/2005 | Nii | ...................... H01L 27/1104 |
| | | | 257/297 |
| 6,990,025 B2 | 1/2006 | Kirihata et al. | |
| 7,286,437 B2 | 10/2007 | Kim et al. | |
| 7,508,697 B1 | 3/2009 | Mukhopadhyay et al. | |
| 2001/0038552 A1 | 11/2001 | Ishimaru | |
| 2003/0034571 A1 * | 2/2003 | Nii | ........................ G11C 11/412 |
| | | | 257/321 |
| 2003/0076731 A1 | 4/2003 | Terada | |
| 2008/0192561 A1 | 8/2008 | Huang et al. | |
| 2009/0173971 A1 * | 7/2009 | Houston et al. | ...... G11C 11/412 |
| | | | 257/321 |
| 2009/0303826 A1 | 12/2009 | Perisetty | |
| 2010/0054049 A1 | 3/2010 | Yamaoka et al. | |
| 2013/0154027 A1 | 6/2013 | Liaw | |

FOREIGN PATENT DOCUMENTS

| | | |
|---|---|---|
| CN | 101529374 | 9/2009 |
| CN | 101677015 | 3/2010 |

* cited by examiner

MULTIPORT MEMORY ELEMENT CIRCUITRY

This application is a continuation of patent application Ser. No. 13/149,249, filed May 31, 2011, which is hereby incorporated by reference herein in its entirety. This application claims the benefit of and claims priority to patent application Ser. No. 13/149,249, filed May 31, 2011.

BACKGROUND

Integrated circuits often contain memory elements. Memory elements may be based on cross-coupled inverters and may be used to store data. Each memory element may store a single bit of data.

Memory elements are often arranged in arrays. In a typical array, data lines are used to write data into the memory elements and are used to read data from the memory elements that have been loaded with data. Address lines may be used to select which of the memory elements are being accessed.

The memory elements may be configured in a dual-port arrangement. A conventional dual-port memory element includes a bi-stable latching circuit that stores a single bit of data (i.e., a latching circuit based on a pair of cross-coupled inverters). The latching circuit is connected to a write port (i.e., write data lines) through a set of write address transistors. The latching circuit is also connected to a read port (i.e., read data lines) through a set of read address transistors. The set of write address transistors are controlled by write address signals conveyed over a write address line, whereas the set of read address transistors are controlled by read address signals conveyed over a read address line. The read data lines are typically precharged to a high voltage value prior to read/write operations.

The conventional dual-port memory element may perform read operations using the read port and write operations using the write port. The read and write operations are controlled asynchronously using different address signals (i.e., read operations are controlled using read address signals, whereas write operations are controlled using write address signals). As a result, it is possible that the read address signal is high at the same time the write address signal is high during a write operation. This scenario in which the read port is enabled during a write operation may be referred to as a read-disturb write.

Enabling the read address transistors while the write address transistors are turned on may counteract the data loading process being performed by the write address transistors. Writing data in this way may undesirably increase the period of time that the write address signals are asserted to ensure proper loading of data. Asserting the write address signals for longer time periods limits the performance of the memory element.

SUMMARY

Integrated circuits may include multiport memory elements. The memory elements are sometimes referred to as memory cells. The memory elements may be organized into multiple groups (or words) using any suitable type of interleaving memory architecture (e.g., a non-interleaved scheme, a single-bit-interleaved scheme, a two-bit-interleaved scheme, a three-bit-interleaved scheme, etc.).

A multiport memory cell may include a latching circuit (sometimes referred to as a storage element) having first and second data storage nodes, a set of write access transistors, and a set of read access transistors. The write access transistors and the read access transistors may be controlled asynchronously using write control signals and read control signals, respectively. The latching circuit may a bi-stable element based on at least two cross-coupled inverters. Each of the cross-coupled inverters may include a pull-up transistor (e.g., a p-channel transistor) and a pull-down transistor (e.g., an n-channel transistor).

The set of write access transistors may couple the data storage nodes to write data lines, whereas the set of read access transistors may couple the data storage nodes to read data lines. The set of write access transistors may be controlled by a write address signal, whereas the set of read access transistors may be controlled by a read address signal. The pull-down transistors and the set of read access transistors may have body bias terminals that are controlled by a control voltage.

The memory cell may be operable in normal mode (e.g., a data retention or hold mode), read mode, write mode, and other modes of operation. During data retention mode, the read and write access transistors are turned off while the latching circuit stores data. During read mode, the read access transistors are turned on to read data from the data storage nodes of the memory cell.

During data loading operations, write access transistors are turned on to write data into the data storage nodes of the memory cell. The read access transistors may also be turned on to read data from the memory cell during the data loading operation.

The control voltage may be momentarily elevated to an intermediate voltage level during data loading operations to reverse bias the pull-down and read access transistors. Reverse biasing the pull-down and read access transistors using this approach may weaken the pull-down and read access transistors and improve the write performance of the memory cell.

Further features of the present invention, its nature and various advantages will be more apparent from the accompanying drawings and the following detailed description.

DETAILED DESCRIPTION

Embodiments of the present invention relate to integrated circuit memory elements with multiple ports. The memory elements, which are sometimes referred to as cells, may contain any suitable number of transistors.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
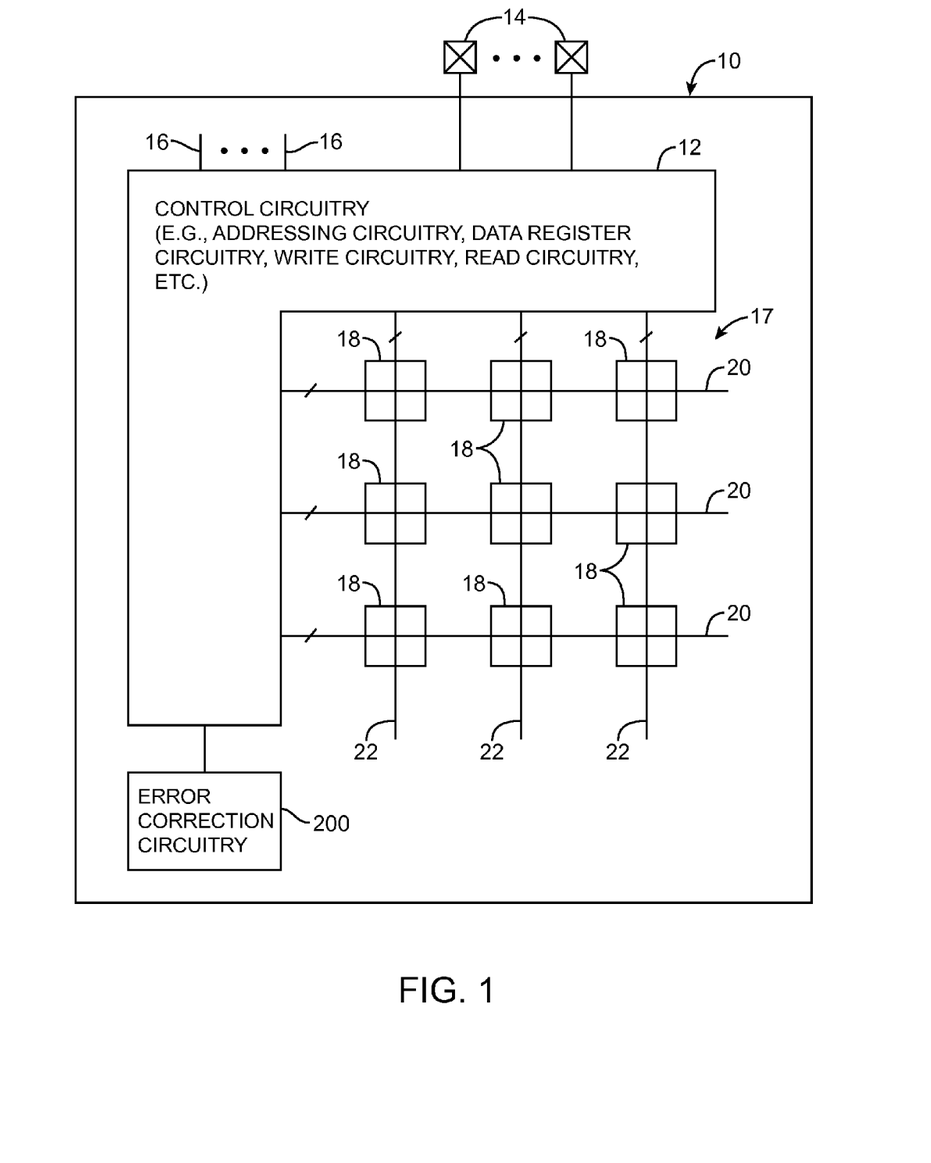
FIG. 1 is a diagram of an illustrative integrated circuit with memory element circuitry in accordance with an embodiment of the present invention.

FIG. 1 shows an integrated circuit that may include an array of memory elements (cells) 18. Any suitable memory array architecture may be used for memory cells 18. One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18.

With one suitable approach, complementary metal-oxide-semiconductor (CMOS) integrated circuit technology is used to form memory elements 18, so CMOS-based memory element implementations are described herein as an example. If desired, other integrated circuit technologies may be used to form the memory elements and the integrated circuit in which the memory elements are used to form memory arrays.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by pins 14 to produce desired time-varying and fixed signals on paths such as paths 20 and 22.

There may, in general, be any suitable number of conductive lines associated with paths 20 and 22. For example, each row of array 17 may have associated address lines (e.g., true and complementary address lines) in a respective one of paths 20 (as an example). Each column of array 17 may have associated data lines (e.g., true and complementary data lines) in a respective one of paths 22. Address lines 20 may sometimes be referred to as word lines, whereas data lines 22 may sometimes be referred to as bit lines.

In one embodiment, a clear signal may be routed to all of the cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each cell 18 using a pattern of shared horizontal or vertical conductors. A ground voltage Vss may likewise be supplied in parallel to cells 18 using a pattern of shared horizontal or vertical lines. Control lines such as address lines and data lines are typically orthogonal to each other (e.g., address lines are vertical while data lines are horizontal or vice versa).

The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, data signals, address signals, clear signals, etc. These different signal types are not mutually exclusive. For example, a clear signal for array 17 may serve as a type of control (address) signal that can be used to clear array 17. This clear signal may also serve as a type of power signal by powering inverter-based circuitry in cells 18. Likewise, because clearing operations serve to place logic zeros in memory cells 18, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, less than 0.9 volts, or other suitable voltages. Ground voltage Vss may be zero volts (as an example). In a typical arrangement, power supply voltages Vcc may be 0.85 volts, Vss may be zero volts, and the signal levels for address, data, and clear signals may range from zero volts (when low) to 0.85 volts (when high). Arrangements in which Vcc varies as a function of time, in which Vss is less than zero volts, and in which control signals are overdriven (i.e., in which control signals have signal strengths larger than Vcc) may also be used.

As shown in FIG. 1, integrated circuit 10 may include error correction circuitry such as error correction circuitry 200. Error correction circuitry 200 may, for example, be an error-correcting code (ECC) circuit. Error correction circuitry 200 is coupled to control circuitry 12 and serves to detect and correct errors that may be present in memory array 17.

For example, memory cells 18 may be subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. Memory cells 18 contain transistors and other components that are formed from a patterned silicon substrate.

When an atomic particle strikes the silicon in a given memory cell 18, electron-hole pairs are generated. The electron-hole pairs create a conduction path that can cause a charged node in the given memory cell to discharge and the state of the given memory cell to flip. If, for example, a logic "1" was stored in the memory cell, a soft error upset event could cause the "1" to change to a "0."

Upset events in an integrated circuit corrupt the data stored in the memory elements and can have serious repercussions for system performance. ECC circuitry 200 may serve to detect errors caused by such soft error upset events and to correct the detected errors by loading corrected data back into memory cells that store erroneous data. Circuitry 200 may, for example, be capable of detecting single-bit errors, adjacent double-bit errors, adjacent triple-bit errors, etc. Circuitry 200 may be capable of correcting single-bit errors, adjacent double-bit errors, etc.

Figure 2:
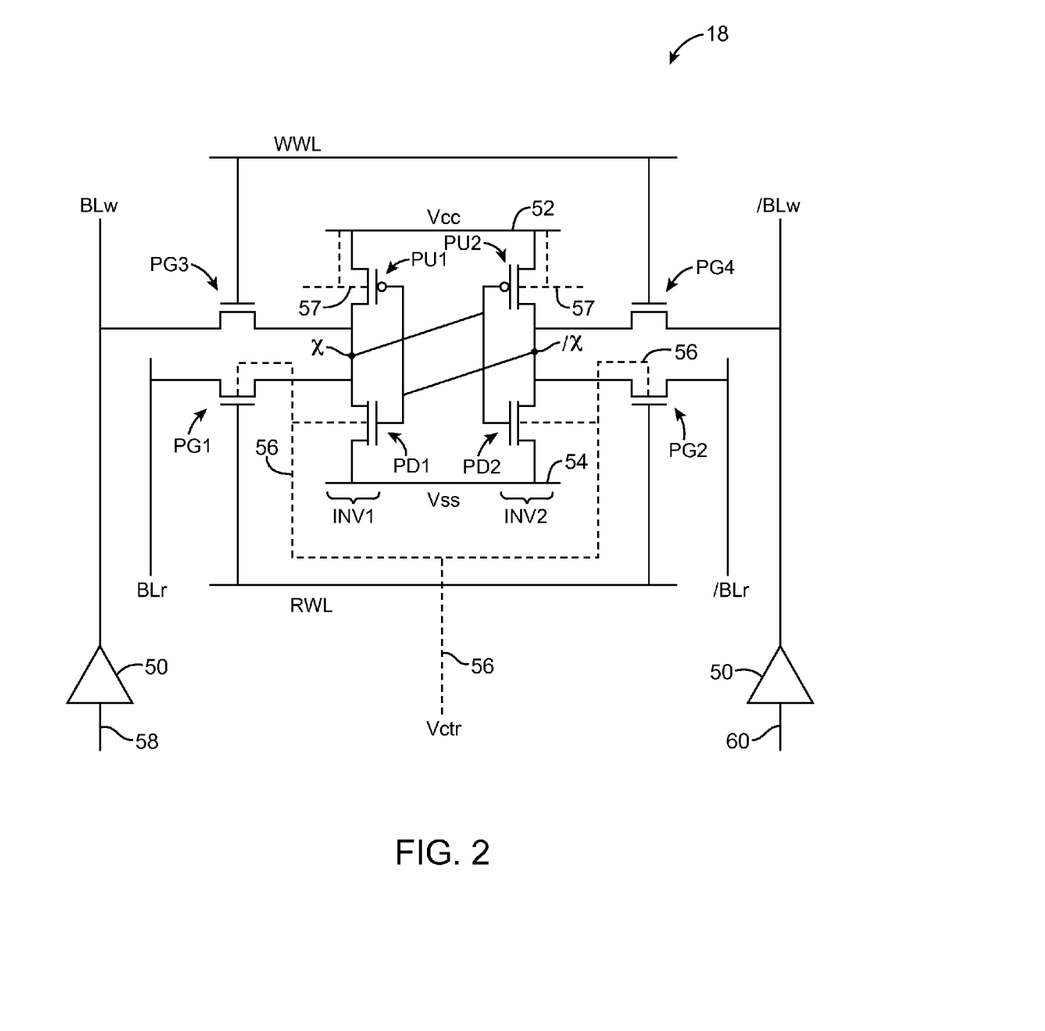
FIG. 2 is a circuit diagram of an illustrative multiport memory element in accordance with an embodiment of the present invention.

FIG. 2 is a circuit diagram showing illustrative memory cell 18 configurable to provide improved write margins that satisfy performance criteria. As shown in FIG. 2, memory cell 18 may include a storage portion (e.g., a latching element) having a pair of cross-coupled inverters INV1 and INV2. The storage portion of cell 18 may include more than two interconnected inverters, if desired.

Inverter INV1 may include a p-channel transistor PU1 and an n-channel transistor PD1 coupled in series between a positive power supply line 52 (e.g., a power supply line on which positive power supply voltage Vcc is provided) and a ground power supply line 54 (e.g., a ground line on which ground power supply voltage Vss is provided). Inverter INV2 may include a p-channel transistor PU2 and an n-channel transistor PD2 coupled in series between positive power supply line 52 and ground power supply line 54. When enabled, transistors PU1 and PU2 serve to pull the internal data storage nodes of cell 18 high and are therefore sometimes referred to as pull-up transistors. When enabled, transistors PD1 and PD2 serve to pull the internal data storage nodes of cell 18 low and are therefore sometimes referred to as pull-down transistors.

Inverters INV1 and INV2 each have an input and an output. The output of inverter INV1 may be coupled to the input of inverter INV2, whereas the output of inverter INV2 may be coupled to the input of inverter INV1 (e.g., inverters INV1 and INV2 form a pair of cross-coupled inverters). The output of inverter INV1 may serve as a first internal data storage node X, whereas the output of inverter INV2 may serve as a second internal data storage node /X (see, e.g., FIG. 2).

The storage portion of memory cell 18 may be a bi-stable latching circuit that can store a single data bit. For example, loading cell 18 with a logic "1" may result in data storage node X being driven high and data storage node /X being driven low, whereas loading cell 18 with a logic "0" may result in data storage node X being driven low and data storage node /X being driven high. Data storage nodes X and /X may have complementary data values (e.g., if X is high, /X is low, vice versa).

A transistor such as n-channel transistor PG1 may be coupled between a first read data line (e.g., a bit line on which true read bit line signal BLr is provided) and data storage node X, whereas a transistor such as n-channel transistor PG2 may be coupled between a second read data line (e.g., a bit line on which complementary read bit line signal /BLr is provided) and data storage node /X. Transistors PG1 and PG2 may each have a gate that is controlled by read control signal RWL (sometimes referred to as a read word line signal or read address signal). Transistors PG1 and PG2 may be turned on to read data from the storage portion of cell 18. Transistors PG1 and PG2 may sometimes be referred to as read access transistors, read address transistors, read pass transistors, read pass gate transistors, etc.

As shown in FIG. 2, pull-down transistors PD1 and PD2 and read access transistors PG1 and PG2 may each have a body bias terminal that is controlled by signal Vctr (e.g., control signal Vctr may be conveyed to the respective body bias terminals over path 56). Path 56 may be coupled to circuitry 12. Control voltage Vctr may be equal to ground power supply voltage Vss during normal operation. During write operations, Vctr may be temporarily adjusted to a voltage level that is greater than Vss.

For example, Vctr may be raised to 0.5 V during data loading operations to reverse bias the pull-down transistors and the read access transistors, thereby weakening these transistors. Voltage Vctr may be adjusted by control circuitry 12 to be at least 0.1 V, at least 0.3 V, at least 0.5 V, etc. The combination of weakening pull-down transistors PD1 and PD2 relative to transistors PG3 and PG4 and weakening read transistors PG1 and PG2 to reduce charge sharing between the read bit lines and the internal data storage nodes may sufficiently improve the write margin of cell 18 to satisfy performance criteria.

Pull-up transistors PU1 and PU2 may each have a body bias terminal 57 that is connected to positive power supply line 52 (see, e.g., FIG. 2). Connected in this way, the body bias terminals of the pull-up transistors may receive a fixed body bias voltage (e.g., Vcc). If desired, body bias terminals 57 of pull-up transistors PU1 and PU2 may receive adjustable voltages from control circuitry 12 to adjust the strength of transistors PU1 and PU2 during read/write operations.

N-channel transistor PG3 may be coupled between a first write data line (e.g., a bit line on which true write bit line signal BLw is provided) and data storage node X, whereas n-channel transistor PG4 may be coupled between a second write data line (e.g., a bit line on which complementary write bit line signal /BLw is provided) and data storage node /X. Transistors PG3 and PG4 may each have a gate that is controlled by write control signal WWL (sometimes referred to as write word line signal or write address signal). Transistors PG3 and PG4 may be turned on to load desired data into the storage portion of cell 18. Transistors PG3 and PG4 may sometimes be referred to as write access transistors, write address transistors, write pass transistors, write pass gate transistors, etc.

As shown in FIG. 2, write driver circuits such as write drivers 50 may be coupled to the write data lines. For example, first write driver 50 may have an input 58 and an output. The output of first write driver 50 may be coupled to the first write data line. Second write driver 50 may have an input 60 and an output. The output of second write driver 50 may be coupled to the second write data line. Write driver circuits 50 may serve to drive the first and second write data lines to desired values when loading data into memory cell 18.

Memory cell 18 of the type described in connection with FIG. 2 is merely illustrative. If desired, multiport memory cell 18 may be implemented using a single-end read/write arrangement in which a single write address transistor is coupled between a write data line and a selected one of the data storage nodes and a single read address transistor is coupled between a read data line and a selected one of the data storage nodes.

Memory cell 18 may be operable in normal mode (e.g., a data retention or hold mode), read mode, write mode, etc. During each of these modes, the storage portion of cell 18 may be powered using power supply voltages Vcc and Vss.

For example, inverters INV1 and INV2 may be powered using a Vcc of 0.85 V and a Vss of zero volts.

During data retention mode, control signals WWL and RWL are low. The storage portion of memory cell 18 may hold the data value currently being stored in cell 18 provided that device 10 is powered up (e.g., as long as device 10 is supplied with Vcc and Vss).

During read mode, control signal WWL is low. Read data line signals BLr and /BLr may be precharged to a high voltage level prior to asserting read word line signal RWL. Read word line signal RWL may be asserted to turn on access transistors PG1 and PG2 to read data from cell 18.

For example, consider a scenario in which memory cell 18 is storing a "1" (e.g., data storage node X is high and data storage node /X is low). When RWL is asserted, BLr may remain high whereas /BLr may discharge towards a low voltage value (e.g., current flowing through transistors PG2 and PD2 will discharge the second read data line towards ground). A read sensing circuit such as a sense amplifier may receive signals BLr and /BLr and may be used to determine the polarity of data being read from cell 18. For example, if BLr is greater than /BLr, the sense amplifier may output a corresponding signal indicating that a logic "1" is being read from cell 18. If BLr is less than /BLr, the sense amplifier may output a corresponding signal indicating that a logic "0" is being read from cell 18.

During write mode, control signal RWL may be low and signal Vctr may be raised to an intermediate voltage level (e.g., 0.4 V) to reverse bias pull-down transistors PD1 and PD2. Reverse biasing pull-down transistors PD1 and PD2 during write mode may serve to weaken the ability of cell 18 to retain its current value (e.g., cell 18 may be more susceptible to being overwritten when transistors PD1 and PD2 are weakened).

Read access transistors PG1 and PG2 may be turned off during write mode. Predetermined data values may be supplied to inputs 58 and 60 of write drivers 50. Inputs 58 and 60 may, for example, be low and high, respectively, to load a "0" into memory cell 18. If input 58 is low, first driver 50 will pull signal BLw low. If input 60 is high, second driver 50 will pull signal /BLw high. Write drivers 50 may also be inverting circuits, if desired. Write word line signal WWL may be asserted. Asserting WWL will enable access transistor PG3 to write a "0" into data storage node X and will enable access transistor PG4 to write a "1" into data storage node /X (as an example).

Read access transistors PG1 and PG2 may be turned on during write mode, because the read and write access transistors are asynchronously controlled using different address signals. During such scenarios (e.g., during a read-disturb write), voltage Vctr may be raised to an intermediate voltage level (e.g., 0.3 V) to reverse bias pull-down transistors PD1 and PD2 and read access transistors PG1 and PG2. Reverse biasing transistors PD1, PD2, PG1, and PG2 may serve to improve the write-ability of cell 18 so that the amount of time required to load new data into cell 18 is reduced compared to a scenario in which Vctr stays fixed at Vss.

During the read-disturb write, a new data value may be written into memory cell 18 and old/new data may be read from memory cell 18 in parallel. This is accomplished by using the write port to load data into cell 18 (e.g., by using write access transistors PG3 and PG4 to pass desired data values into the internal data storage nodes) and by using the read port to read data from cell 18 (e.g., by using access transistors PG1 and PG2 to read data from the internal data storage nodes) in parallel.

Figure 3A:
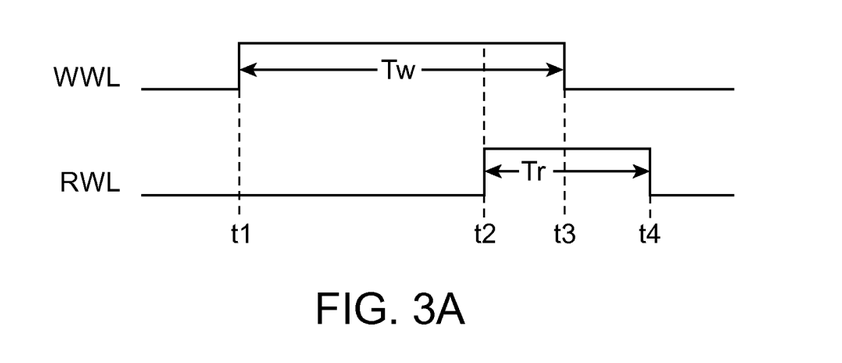
FIGS. 3A and 3B are timing diagrams illustrating a read-disturb write in accordance with an embodiment of the present invention.
Figure 3B:
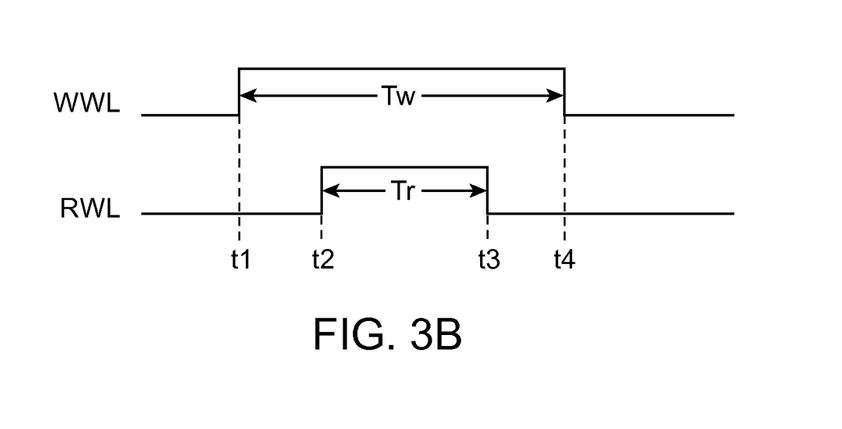

As shown in FIGS. 3A and 3B, address signals WWL and RWL may be asynchronously pulsed high to result in a read-disturb write. FIG. 3A illustrates one possible signal behavior during a read-disturb write. At time t1, signal WWL may be asserted. At time t2, signal RWL may be asserted. Signal RWL may be asserted prior to deasserting signal WWL.

At time t3, signal WWL may be deasserted. The time period from asserting WWL to deasserting WWL (i.e., from time t1 to t3) may be referred to as a write period Tw. At time t4, signal RWL may be deasserted. The time period from asserting RWL to deasserting RWL (i.e., from time t2 to t4) may be referred to as a read period Tr. At time t4, data may or may not be successfully read from cell 18.

In the example of FIG. 3A, WWL is deasserted before RWL is deasserted. Write period Tw and read period Tr may therefore have an overlapping period from time t2 to t3 (e.g., a period during which signals WWL and RWL are simultaneously high). During this overlapping period, the write operation being performed using transistors PG3 and PG4 may be hindered by the charge sharing introduced when transistors PG1 and PG2 are in the on state. Nevertheless, reverse biasing the pull-down transistors and the read address transistors ensures that Tw can be sufficiently short to satisfy design criteria (e.g., new data may be properly loaded into cell 18 before deasserting WWL).

As an example, signal WWL may be asserted for 1 ns (e.g., Tw may be 1 ns), whereas signal RWL may be asserted for 500 ps (e.g., Tr may be 500 ps). Pulses Tw and Tr may have an overlapping period that is 250 ps in duration (as an example). Tw and Tr may be configured to have other suitable pulse widths that satisfy performance criteria, if desired.

FIG. 3B illustrates another possible signal behavior during a read-disturb write. At time t1, signal WWL may be asserted. At time t2, signal RWL may be asserted. At time t3, signal RWL may be deasserted. At time t3, data may or may not be successfully read from cell 18. At time t4, signal WWL may be deasserted.

In the example of FIG. 3B, RWL is deasserted before WWL is deasserted. Write period Tw and read period Tr may therefore have an overlapping period from time t2 to t3 (e.g., a period during which signals WWL and RWL are simultaneously high). During this overlapping period, the write operation being performed using transistors PG3 and PG4 may be delayed by the charge sharing between the read data lines and the data storage nodes that occurs when transistors PG1 and PG2 are enabled. Nevertheless, reverse biasing the pull-down transistors and the read address transistors by momentarily raising Vctr ensures that Tw can be sufficiently short to satisfy performance criteria (e.g., new data may be properly loaded into cell 18 before asserting WWL).

As an example, signal WWL may be asserted for 800 ps (e.g., Tw may be 800 ps), whereas signal RWL may be asserted for 400 ps (e.g., Tr may be 400 ps). The overlapping period may be 400 ps, because the read word line pulse is asserted entirely within the write word line pulse (see, e.g., FIG. 3B). Tw and Tr may be configured to have other suitable pulse widths that satisfy performance criteria, if desired.

If desired, other ways of weakening the storage element of memory cell 18 may be used during data loading operations. For example, the strength of the pull-up transistors may be weakened, positive power supply voltage Vcc may be momentarily lowered, ground power supply voltage Vss may be momentarily elevated, etc.

Figure 4A:
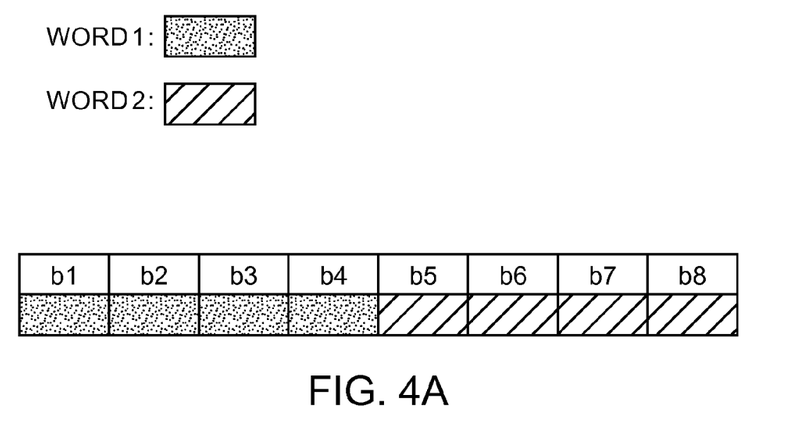
FIG. 4A is a diagram of an illustrative row of memory elements arranged using a non-interleaving scheme in accordance with an embodiment of the present invention.

Each row of memory cells 18 may be organized into respective groups of words. FIG. 4A is a diagram illustrating a row of memory elements 18 that is arranged into first and second groups using a non-interleaving scheme. In the example of FIG. 4A, a row may include eight bits of memory b1-b8. Bits b1-b4 may be associated with the first group (e.g., a first word WORD1), whereas bits b5-b8 may be associated with the second group (e.g., a second word WORD2). Bits associated with the same group may be formed next to each other. For example, bits b1-b4 associated with WORD1 are formed without any intervening cells, whereas bits b5-b8 are formed without any intervening cells.

Memory elements 18 associated with WORD1 may be coupled to a first read word line and a first write word line to receive first read word line signal RWL and first write word line signal WWL, respectively. Memory elements 18 associated with WORD2 may be coupled to a second read word line and a second write word line to receive second read word line signal RWL and second write word line signal WWL, respectively. Asserting control signals on a selected word line for a given word may turn on the corresponding address transistors in memory elements 18 that are associated with the given word. For example, asserting the first write word line signal may turn on transistors PG3 and PG4 in memory elements 18 associated with WORD1, whereas asserting the second read word line signal may turn on transistors PG1 and PG2 in memory elements 18 associated with WORD2.

The non-interleaved scheme of FIG. 4A may support up to three-bit error detection and correction within the same word. For example, if radiation impinging on memory cell 18 causes erroneous data to be stored in memory cells 18 in bit positions b6 to b8, device 10 may be capable of detecting and correct this error. As another example, if radiation impinging on memory cell 18 causes erroneous data to be stored in memory cells 18 in bit positions b1-b4, device 10 may not be capable of detecting and correcting this error because this is a four-bit error in WORD1.

A selected one of the first and second write word line signals WWL (and corresponding RWL, if desired) may be asserted to load data into a given memory cell 18. Reverse body biasing voltage Vctr associated with the given memory cell may be elevated during write operations. The write data lines associated with the given memory cell may be driven to desired values to load data into the given memory cell, whereas the read data lines associated with the given memory cell remains precharged. The write data lines and the read data lines associated with remaining cells in WORD1 may also remain precharged.

For example, consider a scenario in which control circuitry 12 loads a "1" into memory element 18 in bit position b3. First write word line signal WWL and first read word line signal RWL may be pulsed high as described in connection with FIGS. 3A and 3B. Second write word line signal WWL and second read word line signal RWL may be deasserted. Write bit line signals BLw and /BLw associated with memory element 18 in bit position b3 may be driven high and low, respectively. Vctr associated with memory element 18 in bit position b3 may be temporarily elevated to improved write performance (e.g., Vctr may be momentarily increased to 0.5 V). The write and read bit line signals associated with other cells 18 in WORD1 and WORD2 may remain precharged, whereas voltage Vctr associated with other cells 18 in WORD1 and WORD2 may remain at nominal voltage levels (e.g., at zero volts).

Figure 4B:
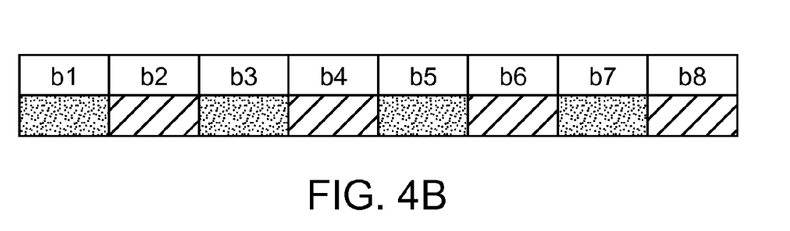
FIG. 4B is a diagram of an illustrative row of memory elements arranged using a single-bit-interleaved scheme in accordance with an embodiment of the present invention.

FIG. 4B is a diagram illustrating a row of memory elements 18 that is arranged into multiple groups in a single-bit-interleaving scheme. In the example of FIG. 4B, bits b1, b3, b5, and b7 may be associated with first group WORD1, whereas bits b2, b4, b6, and b8 may be associated with second group WORD2. As shown in FIG. 4B, memory elements 18 associated with WORD1 may be interlaced with memory elements 18 associated with WORD2 (e.g., a given memory element associated with WORD1 may have adjoining memory elements that are associated with WORD2).

The single-bit-interleaved scheme may support an improved error detection capability compared to the error detection capability described in connection with FIG. 4A. For example, if radiation impinging on memory cell 18 causes erroneous data to be stored in memory cells 18 in bit positions b1-b4, device 10 may be capable of detecting and correcting this error because only two bits in WORD1 (i.e., bits b1 and b3) are erroneous and only two bits in WORD2 (i.e., bits b2 and b4) are erroneous.

Memory elements 18 associated with WORD1 may be coupled to a first read word line and a first write word line to receive first read word line signal RWL and first write word line signal WWL, respectively. Memory elements 18 associated with WORD2 may be coupled to a second read word line and a second write word line to receive second read word line signal RWL and second write word line signal WWL, respectively. Asserting address signals on a selected word line for a given word may turn on the corresponding address transistors in memory elements 18 that are associated with the given word. The memory cells of FIG. 4B may be loaded using a similar approach described in connection with FIG. 4A.

Figure 4C:
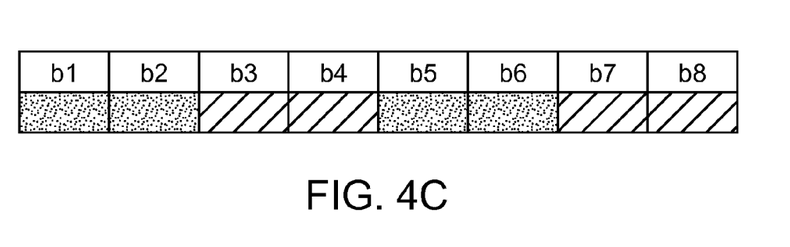
FIG. 4C is a diagram of an illustrative row of memory elements arranged using a two-bit-interleaved scheme in accordance with an embodiment of the present invention.

FIG. 4C is a diagram illustrating a row of memory elements 18 that is arranged into multiple groups in a two-bit-interleaving scheme. In the example of FIG. 4C, bits b1, b2, b5, and b6 may be associated with first group WORD1, whereas bits b3, b4, b7, and b8 may be associated with second group WORD2. As shown in FIG. 4C, each pair of memory elements 18 associated with WORD1 may be interlaced with pairs of memory elements 18 associated with WORD2 (e.g., a given adjacent pair of memory elements associated with WORD1 may have adjoining pairs of adjacent memory elements that are associated with WORD2).

Memory elements 18 associated with WORD1 may be coupled to a first read word line and a first write word line to receive first read word line signal RWL and first write word line signal WWL, respectively. Memory elements 18 associated with WORD2 may be coupled to a second read word line and a second write word line to receive second read word line signal RWL and second write word line signal WWL, respectively. Asserting address signals on a selected word line for a given word may turn on the corresponding address transistors in memory elements 18 that are associated with the given word.

A selected one of the first and second write word line signals WWL (and corresponding RWL, if desired) may be asserted to load data into a given pair of adjacent memory cells 18. Reverse body biasing voltage Vctr associated with the given pair of adjacent memory cells may be elevated during write operations. The write data lines associated with the given pair of memory cells may be driven to desired values to load data into the given pair of memory cells, whereas the read data lines associated with the given pair of memory cells are precharged. The write data lines and the read data lines associated with remaining cells in WORD1 may also be precharged.

For example, consider a scenario in which control circuitry 12 loads a "0" and a "1" into memory elements 18 in bit positions b7 and b8, respectively. Second write word line signal WWL and second read word line signal RWL may be pulsed high in a way described in connection with FIGS. 3A and 3B. First write word line signal WWL and first read word line signal RWL may be deasserted. Write bit line signals BLw and /BLw associated with memory element 18 in bit position b7 may respectively be low and high, whereas write bit line signals BLw and /BLw associated with memory element 18 in bit position b8 may respectively be high and low. Vctr associated with memory elements 18 in bit positions b7 and b8 may be temporarily elevated to improved write performance (e.g., Vctr may be momentarily increased to 0.6 V). The write and read bit line signals associated with other cells 18 in WORD1 and WORD2 may be precharged, whereas voltage Vctr associated with other cells 18 in WORD1 and WORD2 may remain at nominal voltage levels (e.g., zero volts).

The single-bit-interleaved scheme may support an improved error detection capability compared to the error detection capability described in connection with FIG. 4A. For example, if radiation impinging on memory cell 18 causes erroneous data to be stored in memory cells 18 in bit positions b3-b7, device 10 may be capable of detecting and correcting this error because only three bits in WORD1 (i.e., bits b3, b4, and b7) are erroneous and only two bits in WORD2 (i.e., bits b5 and b6) are erroneous.

ECC circuitry 200 (of FIG. 1) may be used to detect and correct adjacent triple-bit errors for memory cells 18 that are organized using the arrangement of FIGS. 4A, 4B, and 4C. If desired, ECC circuitry 200 may be configured to detect and correct adjacent double-bit upsets, adjacent four-bit upsets, etc.

The arrangements of FIGS. 4A-4C are merely illustrative. A row of memory elements 18 may include hundreds or thousands of memory elements organized into multiple groups (e.g., into three or more words, four or more words, five or more words, etc.) using any type of interleaving configuration.

Figure 5:
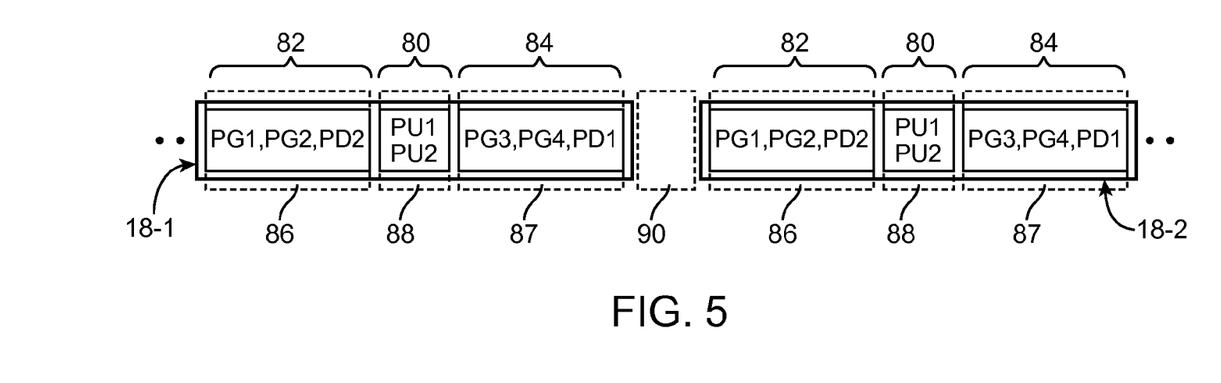
FIG. 5 is a diagram illustrating the arrangement of memory element transistors for the interleaving scheme shown in connection with FIG. 4B in accordance with an embodiment of the present invention.

FIG. 5 is a top layout view of two adjacent memory cells 18 in a row of memory cells 18 arranged using the single-bit interleaved configuration described in connection with FIG. 4B. As shown in FIG. 5, a doped well such as n-well 90 may be interposed between first memory cell 18-1 (e.g., a memory element associated with a first word) and second memory cell 18-2 (e.g., a memory element associated with a second word). Each of the first and second memory cells may include n-channel transistors PG1, PG2, and PD2 formed in p-well 86 (see, e.g., region 82 in FIG. 5), re-channel transistors PG3, PG4, and PD1 formed in p-well 87 (see, e.g., region 84 in FIG. 5), and p-channel transistors PU1 and PU2 formed in n-well 88 (see, e.g., region 80 in FIG. 5).

N-well 90 formed between memory cells 18-1 and 18-2 may serve to separate p-well 87 of cell 18-1 from successive p-well 86 of second cell 18-2. Separating the p-wells of adjacent memory cells in this way may allow the p-wells associated with each memory cell 18 to be independently biased at desired levels (e.g., the p-well of a memory element may be selectively reverse biased by elevating Vctr associated with that memory element while signals Vctr associated with other memory elements remain low).

Figure 6:
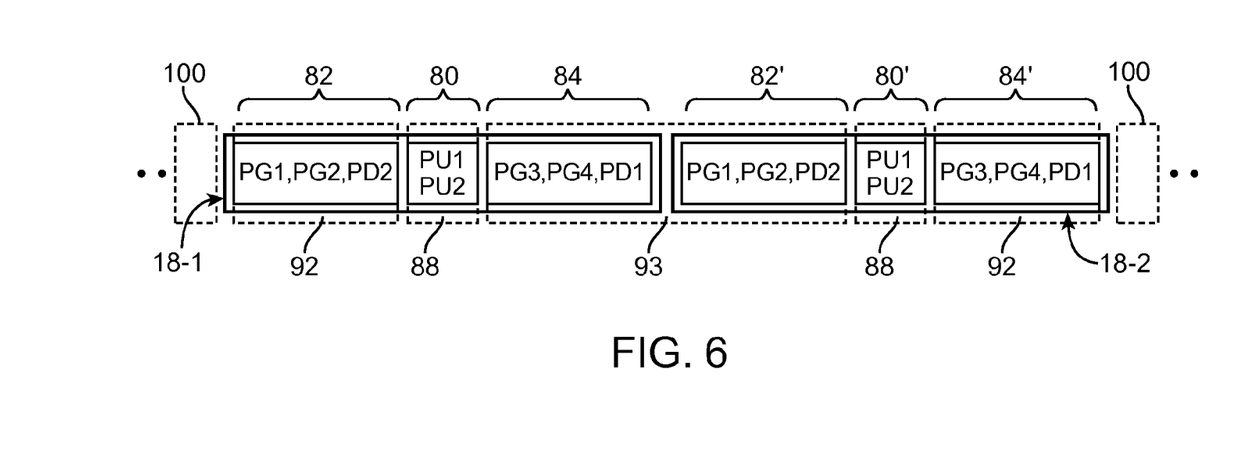
FIG. 6 is a diagram illustrating the arrangement of memory element transistors for the interleaving scheme shown in connection with FIG. 4C in accordance with an embodiment of the present invention.

FIG. 6 is a top layout view of two adjacent memory cells in a row of memory cells arranged using the two-bit interleaved configuration described in connection with FIG. 4C. First and second memory cells 18-1 and 18-2 of FIG. 6 are associated with the same word (e.g., WORD1). First memory cell 18-1 may include n-channel transistors PG1, PG2, and PD2 formed in p-well 92 (see, e.g., region 82 in FIG. 6), n-channel transistors PG3, PG4, and PD1 formed in p-well 93 (see, e.g., region 84 in FIG. 6), and p-channel transistors PU1 and PU2 formed in n-well 88 (see, e.g., region 80 in FIG. 6). Second memory cell 18-2 may include n-channel transistors PG3, PG4, and PD1 formed in p-well 92 (see, e.g., region 84' in FIG. 6), p-channel transistors PU1 and PU2 formed in n-well 88 (see, e.g., region 80' in FIG. 6), and n-channel transistors PG1, PG2, and PD2 formed in p-well 93 (see, e.g., region 82' in FIG. 6).

Sharing p-well 93 between n-channel transistors in the first and second memory elements may serve to reduce the area of memory array 17 compared to memory array 17 formed using the arrangement of FIG. 5. Biasing p-well 93 with an elevated voltage Vctr may reverse bias the corresponding transistors in the pair of adjacent memory cells. As shown in FIG. 6, n-well 100 may be interposed between a pair of adjacent memory cells associated with WORD1 and a pair of adjacent memory cells associated with WORD2 (as an example).

The arrangements of FIGS. 5 and 6 are merely illustrative. The portions shown in FIGS. 5 and 6 may be replicated along an entire row of memory cells having hundreds or thousands of memory cells 18.

Figure 7:
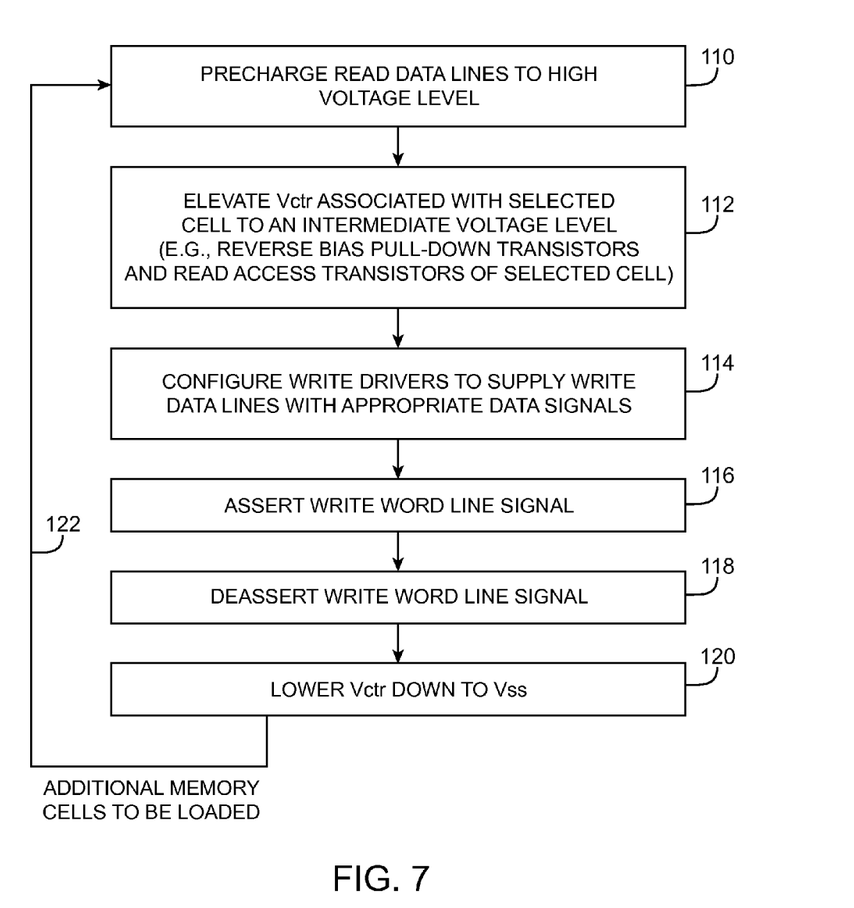
FIG. 7 is a flow chart of illustrative steps involved in loading data into a memory cell during write mode in accordance with an embodiment of the present invention.

FIG. 7 shows illustrative steps involved in loading data into a selected memory cell 18 during write mode. At step 110, the read data lines may be precharged to a high voltage level (e.g., signals BLr and /BLr may be precharged high). At step 112, Vctr associated with the selected memory cell may be raised to an intermediate voltage level to weaken the pull-down and read address transistors of the selected cell.

At step 114, write drivers 50 may be configured to supply the write data lines with appropriate write data values that are to be loaded into the selected memory cell (e.g., BLw and /BLw may respectively be "1" and 0" to load a "1," vice versa).

At step 116, write word line signal WWL may be asserted to turn on the write address transistors in the selected cell. The selected memory cell may be loaded with desired data when WWL is asserted. At step 118, signal WWL may be deasserted. At step 120, Vctr may be lowered back down to ground (e.g., zero volts). Processing may loop back to step 110 if there are additional memory cells to be loaded, as indicated by path 122.

Read word line signal RWL may be asserted at any time during the data loading operation described in connection with FIG. 7. Elevating Vctr may provide improved write performance by mitigating the read disturb while RWL is asserted.

The foregoing is merely illustrative of the principles of this invention and various modifications can be made by those skilled in the art without departing from the scope and spirit of the invention.

What is claimed is:

1. A method of accessing first and second memory elements, comprising:
   asserting a word line signal on a word line that is coupled to the first and second memory elements, wherein the first and second memory elements each include a respective read access transistor;
   providing a fixed body bias voltage to at least one transistor in the first memory element;
   writing data into the first memory element by applying a first control voltage that weakens at least the read access transistor of the first memory element while the word line signal is asserted; and
   preventing data from being written into the second memory element by applying a second control voltage to a body terminal of the read access transistor of the second memory element while the word line signal is asserted.

2. The method defined in claim 1, wherein the first memory element comprises a write access transistor, and wherein applying the first control voltage comprises applying a voltage that weakens the read access transistor of the first memory element without weakening the write access transistor in the first memory element.

3. The method defined in claim 1, wherein the first and second memory elements each include a respective write access transistor, and wherein applying the first control voltage comprises applying a voltage that weakens the read access transistor in the first memory element without weakening the write access transistor in the first memory element.

4. The method defined in claim 1, wherein the first and second memory elements each include a respective write access transistor, and wherein asserting the word line signal comprises asserting a control signal that turns on the write access transistor in the first memory element and that turns on the write access transistor in the second memory element.

5. The method defined in claim 4, further comprising:
asserting an additional word line signal on another word line that turns on the read access transistor in the first memory element and that turns on the read access transistor in the second memory element while the word line signal is asserted.

6. The method defined in claim 1, wherein the first control voltage has a first voltage level, and wherein the second control voltage has a second voltage level that is different than the first voltage level.

7. The method defined in claim 1, wherein applying the first control voltage comprises applying a first body biasing voltage to the read access transistor in the first memory element so that the read access transistor in the first memory element has a first drive strength, and wherein applying the second control voltage comprises applying a second body biasing voltage to the read access transistor in the second memory element so that that read access transistor in the second memory element has a second drive strength that is greater than the first drive strength.

8. Memory array circuitry, comprising:
a first data line;
a second data line that is different than the first data line;
first, second, and third wells;
a first memory cell that is coupled to the first data line and that is arranged in a given row, wherein the first memory cell includes first, second, and third transistors respectively formed in the first, second, and third wells, wherein the first transistor is a read access transistor, and wherein the second transistor is a write access transistor;
a second memory cell that is coupled to the second data line and that is arranged in the given row adjacent to the first memory cell;
an isolation well that is interposed between the first and second memory cells; and
control circuitry that provides an adjustable body bias voltage to the read access transistor and that provides a fixed body bias voltage to the write access transistor.

9. The memory array circuitry defined in claim 8, further comprising:
a first word line that is coupled to the first memory cell; and
a second word line that is different than the first word line and that is coupled to the second memory cell.

10. The memory array circuitry defined in claim 8, wherein the isolation well comprises an n-well.

11. The memory array circuitry defined in claim 8, wherein the first memory cell includes a group of n-channel transistors that receives an adjustable body bias voltage and a group of p-channel transistors that receives a fixed body bias voltage, wherein the group of n-channel transistors includes the first transistor in the first memory cell, and wherein the group of p-channel transistors includes the second transistor in the first memory cell.

12. The memory array circuitry defined in claim 11, wherein the first well comprises a p-well, wherein the second well comprises an n-well that is electrically isolated from the p-well, wherein the group of n-channel transistors is formed in the p-well, and wherein the group of p-channel transistors is formed in the n-well that is electrically isolated from the p-well.

13. An integrated circuit, comprising:
a first data line;
a second data line that is different than the first data line;
a first memory cell that is coupled to the first data line and that is arranged in a given row, wherein the first memory cell comprises a first read access transistor and a first write access transistor;
a second memory cell that is coupled to the second data line and that is arranged in the given row, wherein the second memory cell comprises a second read access transistor and a second write access transistor, and wherein the first and second memory cells share a common well;
an additional well that is separate from the common well, wherein the first read access transistor of the first memory cell is formed in the additional well, and wherein the first write access transistor of the first memory cell is formed in the common well; and
control circuitry that provides an adjustable body biasing voltage to the additional well and that also provides a fixed body biasing voltage to the common well.

14. The integrated circuit defined in claim 13, wherein the common well comprises a shared p-well.

15. The integrated circuit defined in claim 13, further comprising:
a word line that is coupled to the first and second memory cells.

16. The integrated circuit defined in claim 13, wherein the common well comprises a shared p-well, wherein the additional well comprises an additional p-well that is separate from the shared p-well.

17. The integrated circuit defined in claim 16, wherein the shared p-well is receives the fixed body biasing voltage, and wherein the additional p-well receives the adjustable body biasing voltage that weakens the read access transistor in the first memory cell during write operations.

* * * * *